(12) United States Patent
Khemka et al.

(10) Patent No.: US 7,244,989 B2
(45) Date of Patent: Jul. 17, 2007

(54) SEMICONDUCTOR DEVICE AND METHOD OF MANUFACTURE

(75) Inventors: Vishnu K. Khemka, Phoenix, AZ (US); Amitava Bose, Tempe, AZ (US); Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/144,569

(22) Filed: Jun. 2, 2005

(65) Prior Publication Data
US 2006/0273402 A1 Dec. 7, 2006

(51) Int. Cl.
*H01L 29/76* (2006.01)
(52) U.S. Cl. ........................ 257/341; 257/401
(58) Field of Classification Search ........ 257/341–343, 257/339, 401; 438/135
See application file for complete search history.

(56) References Cited

U.S. PATENT DOCUMENTS

| | | |
|---|---|---|
| 5,126,806 A | 6/1992 | Sakurai et al. |
| 5,343,052 A | 8/1994 | Oohata et al. |
| 5,920,087 A | 7/1999 | Nakagawa et al. |
| 5,977,569 A | 11/1999 | Li |
| 6,339,243 B1 * | 1/2002 | Kwon et al. ............... 257/341 |
| 6,888,710 B2 * | 5/2005 | Mallikarjunaswamy et al. ......................... 361/56 |
| 2002/0005559 A1 | 1/2002 | Suzuki |
| 2004/0084744 A1 | 5/2004 | Khemka et al. |

* cited by examiner

*Primary Examiner*—Theresa T. Doan
(74) *Attorney, Agent, or Firm*—Ingrassia Fisher & Lorenz

(57) ABSTRACT

A semiconductor component and method of manufacture, including an insulated gate bipolar transistor (IGBT) (100, 200, 300, 400) that includes a semiconductor substrate (110, 210, 310, 410) having a first conductivity type and buried semiconductor region (115, 215, 315, 415) having a second conductivity type located above the semiconductor substrate. The IGBT further includes a first semiconductor region (120, 220, 320, 420) having the first conductivity type located above the buried semiconductor region, a second semiconductor region (130, 230, 330, 430) having the first conductivity type located above the first semiconductor region, a third semiconductor region (140, 240, 340, 440) having the second conductivity type located above the first semiconductor region, an emitter (150, 250, 350, 450) having the first conductivity type disposed in the third semiconductor region, and a collector (170, 270, 370, 470) having the first conductivity type disposed in the third semiconductor region. In a particular embodiment, the third semiconductor region and the buried semiconductor region deplete the first semiconductor region in response to a reverse bias applied between the second semiconductor region and the third semiconductor region.

12 Claims, 3 Drawing Sheets

SEMICONDUCTOR DEVICE AND METHOD OF MANUFACTURE

FIELD OF THE INVENTION

The present invention generally relates to semiconductor components, and more particularly to semiconductor transistors and methods of manufacture.

BACKGROUND OF THE INVENTION

Power devices are electronic components designed to be tolerant of the high currents and voltages that are present in power applications such as motion controlled air bag deployment and automotive fuel injector drivers. The power lateral double-diffused metal-oxide-semiconductor (LDMOS) field-effect-transistor (FET) device, referred to herein as a power LDMOS device, is becoming increasingly popular for such power applications. As power technologies develop, power applications require smaller and smaller power devices with a high breakdown voltage.

Many applications for power LDMOS devices require the inclusion of a series connected reverse diode on certain output nodes in order to realize voltage blocking capability in both positive and negative directions. When the application cannot tolerate the LDMOS body diode, such as when there is a regular output with no reverse path from the output to the input, a discrete diode in series with the LDMOS or two back-to-back LDMOS structures are used to achieve high breakdown voltage in both directions. There exists a problem with device mismatch when multiple LDMOS devices are required or an LDMOS-diode structure is required. In these types of devices a certain percentage of mismatch is expected. Insulated gate bipolar transistors (IGBTs) provide for an alternative structure.

IGBTs are designed for power applications and combine metal-oxide-semiconductor (MOS) gate control and a bipolar current flow mechanism. An IGBT incorporates features of both a metal-oxide-semiconductor field effect transistor (MOSFET) and a bipolar junction transistor (BJT). IGBTs have higher current density than MOSFETs and faster switching characteristics than BJTs. IGBTs are the primary choice today for high-power (>10 kW), low to medium frequency (up to 30 kHz) applications.

IGBT devices feature high current/high voltage operation and high input impedance at the same time. Replacing power LDMOS multi-structures with an insulated gate bipolar transistor (IGBT) provides significant savings in the required device area. That is, IGBT devices are significantly smaller than an LDMOS-diode structure or a LDMOS-LDMOS structure because the on-resistance in an IGBT is lower.

In addition, conventional LDMOS devices suffer from minority carrier current in to the substrate which can harm the surrounding devices. IGBT device structures are less susceptible to such substrate injection. IGBTs typically, do not have the same reverse recovery time associated with a standard LDMOS body diode.

Accordingly, it is desirable to provide a high voltage IGBT structure for silicon bulk based (non silicon-on-insulator (SOI)) power integrated circuits (ICs). Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals indicate like elements.

DETAILED DESCRIPTION OF THE INVENTION

Figure 1:
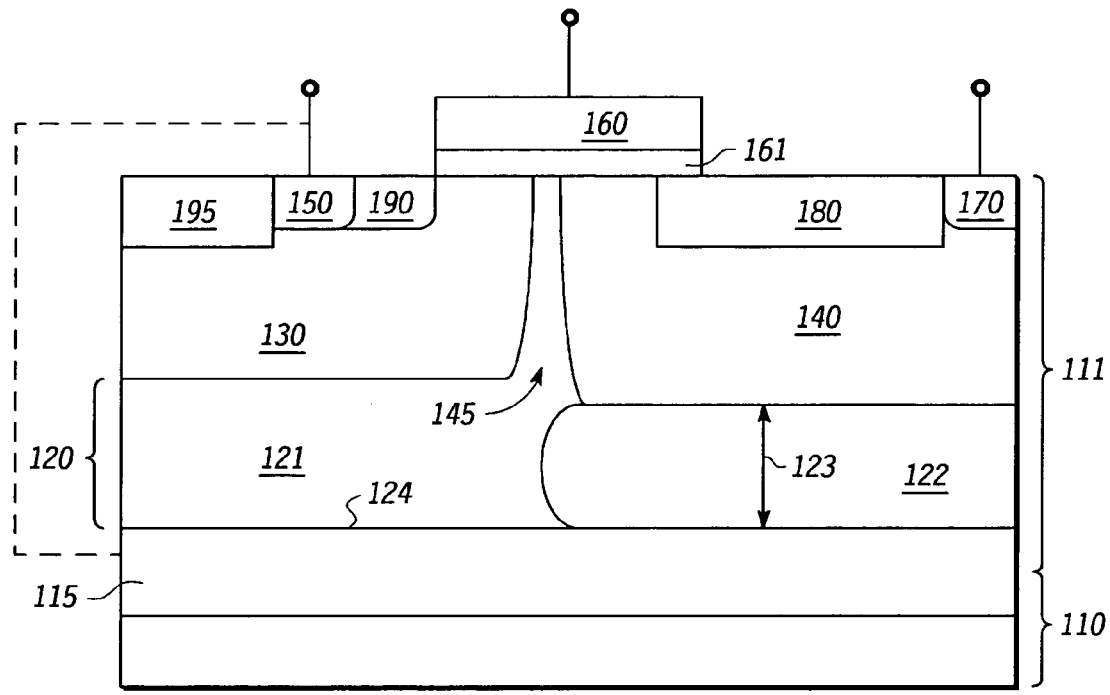
FIG. 1 is a cross-sectional view of a portion of a transistor according to an embodiment of the invention.

The following detailed description of the invention is merely exemplary in nature and is not intended to limit the invention or the application and uses of the invention. Furthermore, there is no intention to be bound by any theory presented in the preceding background of the invention or the following detailed description of the invention.

Existing technology attempts to satisfy the high breakdown voltage requirement in power devices by utilizing a power device having a reduced surface field (RESURF) structure. A power device having a RESURF structure comprises: (1) a first semiconductor region that serves as a RESURF region, having a first conductivity type; and (2) a second semiconductor region that serves as a drift region having a second conductivity type. The RESURF region depletes the drift region, thus reducing the electric field in the drift region and allowing a higher breakdown voltage for the power device. This type of RESURF structure is referred to herein as a "single RESURF" structure.

A double RESURF structure, on the other hand, comprises: (1) first and third semiconductor regions that serve as RESURF regions having a first conductivity type; and (2) a second semiconductor region that serves as a drift region having a second conductivity type. In a double RESURF structure, each of the RESURF regions depletes the drift region, thus reducing the electric field in the drift region to a greater degree than is possible with a single RESURF structure.

A floating RESURF (FRESURF) comprises a buried layer disposed below a RESURF region. The buried layer has the same conductivity type as the drift region and is considered floating because it is not tied to either the emitter or collector. The buried layer acts as a floating island. The presence of this layer provides a novel variation of the RESURF action and helps to increase the breakdown voltage of the device even further. Power transistors, including power LDMOS devices and IGBTs can have either a single or double RESURF structure, and if the buried layer is floating, a FRESURF structure.

An IGBT power device having a single RESURF structure comprises a RESURF transistor that includes a semiconductor substrate having a first conductivity type and a buried semiconductor region having a second conductivity type located above the semiconductor substrate. The RESURF transistor further includes a first semiconductor region having the first conductivity type located above the buried semiconductor region, a second semiconductor region having the first conductivity type located above the first semiconductor region and a third semiconductor region having the second conductivity type located above the first semiconductor region. In the single RESURF transistor, the first and the second semiconductor regions deplete the third semiconductor region, which serves as the drift region, thereby reducing the electric field in the third semiconductor region and allowing higher breakdown voltages. The buried semiconductor region is provided for the purpose of isolation and does not aid in the RESURF action.

An IGBT power device having a double RESURF structure comprises a single RESURF transistor where the buried semiconductor region and the third semiconductor region deplete the first semiconductor region, thereby reducing the electric field in the third semiconductor region to a greater degree than the single RESURF structure. An IGBT power device having a buried layer that is not tied to either the emitter of collector and is electrically floating, is referred to as a floating RESURF (FRESURF) structure.

Referring now to the drawings, FIG. 1 is a cross-sectional view of a portion of a transistor according to an embodiment of the invention. IGBT 100 is a portion of a discrete semiconductor component or an integrated circuit.

IGBT 100 is a composite substrate comprising a semiconductor region or substrate 110 and a semiconductor epitaxial layer 111 deposited on substrate 110 by epitaxial growth. A buried semiconductor region 115 is partially located in semiconductor epitaxial layer 111 and partially in semiconductor substrate 110. A semiconductor region 120 is located in semiconductor epitaxial layer 111 and above buried semiconductor region 115. A semiconductor region 130 is located in semiconductor epitaxial layer 111 and above semiconductor region 120. A semiconductor region 140 is located in semiconductor epitaxial layer 111 and generally above semiconductor region 120, and more particularly region 122. Semiconductor regions 130 and 140 are illustrated as being separated by a portion of semiconductor region 120 that extends to a surface of epitaxial layers 111. It should be understood that in an alternative embodiment, semiconductor regions 130 and 140 can be formed so that they are allowed to touch each other, but this junction may have a negative effect on certain device parameters, such as break-down voltage and ON-resistance.

Semiconductor substrate 110, semiconductor region 120, and semiconductor region 130 have a first conductivity type. Buried semiconductor region 115 and semiconductor region 140 have a second conductivity type. Semiconductor region 120 comprises a first portion 121, at least a substantial part of which is located under semiconductor region 130, and a second portion 122, at least a substantial part of which is located under semiconductor region 140. In one embodiment, first portion 121 is defined by the formation of semiconductor region 130 and semiconductor region 140 and by the doping concentrations within first portion 121 and second portion 122 of semiconductor region 120.

In a particular embodiment of IGBT 100, semiconductor substrate 110 comprises a P-type semiconductor substrate and semiconductor epitaxial layer 111 comprises a P-type epitaxial layer deposited on semiconductor substrate 110. Buried semiconductor region 115 comprises a heavily-doped N-type buried layer. Semiconductor region 120 comprises a P-type semiconductor region, semiconductor region 130 comprises a P-type body region, and semiconductor region 140 comprises an N-type drift region. First portion 121 of semiconductor region 120 can be an original portion of semiconductor epitaxial layer 111. Second portion 122 of semiconductor 120 can comprise a P-type well in semiconductor epitaxial layer 111. In one embodiment, a doping concentration of first portion 121 is less than a doping concentration of second portion 122. The lower doping concentration of first portion 121 increases the breakdown voltage for a junction 124 between semiconductor region 120 and buried semiconductor region 115, while the higher doping concentration of second portion 122 provides a higher punch-through voltage for semiconductor region 120 between semiconductor region 140 and semiconductor substrate 110.

Buried semiconductor region 115 is formed under an active area 145 of IGBT 100. Active area 145 comprises portions of semiconductor region 130 and semiconductor region 140. In the embodiment illustrated in FIG. 1, buried semiconductor region 115 is continuous under all of active area 145 of IGBT 100. The introduction of buried semiconductor region 115 prevents direct punch-through from semiconductor region 130 to semiconductor substrate 110.

In one particular embodiment of IGBT 100, buried semiconductor region 115 can be electrically tied to the same potential as semiconductor region 130, as illustrated in FIG. 1 by a dashed line, thus creating a single RESURF structure wherein semiconductor regions 130 and 122 deplete semiconductor region 140. When buried semiconductor region 115 is tied to the same potential as semiconductor region 130, IGBT 100 is isolated. In another embodiment, buried semiconductor region 115 may be left electrically floating thus creating a floating RESURF structure. A RESURF transistor, including IGBT 100, comprising an electrically floating buried semiconductor region, such as buried semiconductor region 115, may be referred to herein as a Floating RESURF (FRESURF) transistor IGBT 100 further comprises a first current terminal or emitter 150 and a second current terminal or collector 170. IGBT 100 still further comprises an insulating layer 161 positioned on a surface of epitaxial layer 111 in overlying relationship to doped region 120. Generally, insulating layer 161 overlies the surface within (between) region 130 and an oxide region 180. In a preferred embodiment insulating layer 161 is a silicon dioxide or silicon nitride grown or deposited on the surface of epitaxial layer 111. A layer is deposited on insulating layer 161 and processed in a well known manner to produce a contact which operates as a gate terminal 160. In one embodiment, layer 160 is made of polysilicon.

IGBT 100 still further comprises a contact region 190 and an oxide region 195. Oxide region 180 defines a voltage blocking region of transistor 100. The length of region 180 determines how much voltage can be blocked by transistor 100. Semiconductor region 130 serves as a body region, and semiconductor region 140 serves as a drift region. Emitter 150 has the first conductivity type and serves as a contact to the body region 130. Collector 170 has the first conductivity type, and region 190 has the second conductivity type. Contact region 190 allows for MOS gate control. Contact region 190 further provides for channel formation inside semiconductor region 130, under gate 160. Region 190 acts as the source of the MOS gate 160 and enables the MOS gated control. Without the inclusion of region 190, transistor 100 would not operate properly. Region 195 is optional, however, in this particular embodiment of transistor 100, it is used to isolate emitter 150 from an isolation (ISO) terminal (not shown) of transistor 100.

The reverse bias breakdown voltage of IGBT 100 is governed by the reverse bias breakdown potential between the various regions within IGBT 100. More specifically, in response to a voltage applied to a first region having a first conductivity type and a different voltage applied to a second region having a second conductivity type, a voltage difference is set up between the two regions. The voltage difference is often referred to as a potential difference. A reverse bias breakdown potential is the lowest potential difference that will cause breakdown, meaning the lowest potential difference that will cause a current to flow between the two regions that are reverse biased. A device may cease to function, and may be destroyed, when a voltage greater than the reverse bias breakdown potential is applied between two regions, one of which is externally connected. For IGBT 100, the regions that are externally connected are semiconductor region 130 and semiconductor region 140, through emitter 150 and collector 170, respectively. In a particular embodiment of IGBT 100, emitter 150 comprises a P-type region and collector 170 comprises a P-type region. The P-type doping of collector 170 provides the injection of holes into highly resistive semiconductor region 140, having N-type conductivity, and carrier overflow is created. This increases the conductivity of semiconductor region 140 and allows for a reduction in the ON-state voltage of transistor 100.

If one of the two regions is grounded, the reverse bias breakdown voltage of the device equals the reverse bias breakdown potential between the two regions. An N-type region may be biased at, for example, 20 volts so that the potential difference between the two regions is 20 volts. If this 20-volt potential difference is the lowest potential difference that will cause a reverse bias current to flow between the regions, the 20-volt potential difference then becomes the breakdown potential between the regions. Finally, the reverse bias breakdown voltage would also be twenty volts because that would be, in this example, the lowest voltage that could be placed on the non-grounded N-type region that would cause the reverse bias breakdown of the device.

In one Single RESURF embodiment where buried semiconductor region 115 is electrically tied to emitter 150, a thickness 123 of second portion 122 of semiconductor region 120 has a predetermined value such that it is greater than a depletion width in second portion 122 at an onset of reverse bias breakdown between semiconductor region 140 and second portion 122. This is to avoid the situation where region 122 gets fully depleted before breakdown occurs. This will establish a high leakage current path between collector 170 and emitter 150 of IGBT 100 that is detrimental to its operation.

In the Single RESURF embodiment, when a voltage at collector 170 is raised above a voltage at emitter 150, the result will be a reverse bias across IGBT 100. In an embodiment wherein a voltage at collector 170 is raised above a voltage at emitter 150, a collector-to-emitter reverse bias breakdown voltage for IGBT 100 is a breakdown potential between second portion 122 of semiconductor region 120 and semiconductor region 140.

In one embodiment of a floating RESURF (FRESURF) device, a thickness 123 of second portion 122 of semiconductor region 120 has a predetermined value such that it is less than a depletion width in second portion 122 at an onset of reverse bias breakdown between semiconductor region 140 and second portion 122. In this embodiment, buried semiconductor region 115 is electrically coupled to semiconductor region 140 after second portion 122 of semiconductor region 120 is fully depleted in at least a region directly under collector 170. In other words, after second portion 122 is fully depleted, the potential of buried semiconductor region 115 is offset from a potential of semiconductor region 140 by an offset potential. The offset potential is approximately equal to the punch-through voltage of semiconductor region 120.

In the FRESURF embodiment, when a voltage at collector 170 is raised above a voltage at emitter 150 the result will be a reverse bias across IGBT 100. In an embodiment wherein a voltage at collector 170 is raised above a voltage at emitter 150, a collector-to-emitter reverse bias breakdown voltage for IGBT 100 is a sum of a breakdown potential between first portion 121 of semiconductor region 120 and buried semiconductor region 115, or the breakdown potential of junction 124, and the offset potential.

Figure 2:
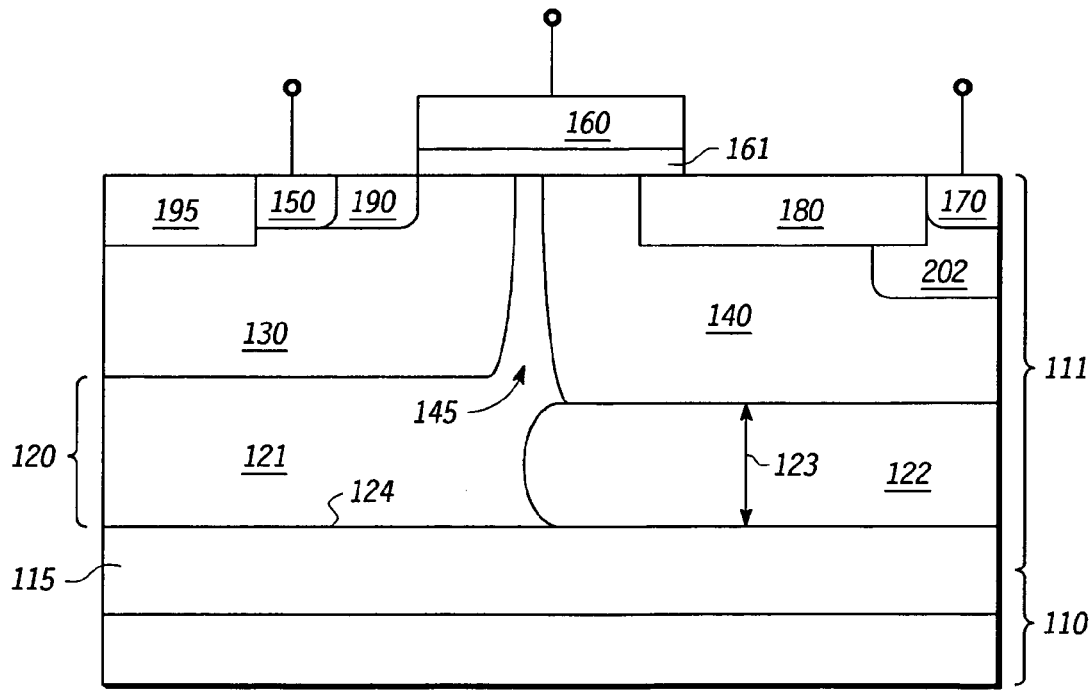
FIG. 2 is a cross-sectional view of a portion of a transistor according to another embodiment of the invention.

FIG. 2 is a cross-sectional view of a portion of an IGBT 200 according to another embodiment of the invention. IGBT 200 is a portion of a discrete semiconductor component or an integrated circuit. IGBT 200 is formed similar to IGBT 100 of FIG. 1 having like numerals to indicate like elements.

In this particular embodiment, IGBT 200 further comprises a buffer region 202 formed in semiconductor region 140. Buffer region 202 provides for punch-through prevention and has the same conductivity type as region 140. If a voltage at collector 170 is raised above a voltage at emitter 150, the result will be a reverse bias across IGBT 200. Under this reverse bias semiconductor region 140 is depleted by both semiconductor region 130 and second portion 122 of semiconductor region 120. In absence of buffer region 202, a situation may arise where semiconductor region 140 is completely depleted so that the depletion layer boundary may touch the collector region 170. This establishes a direct leakage current path between the collector 170 and emitter 150 of IGBT 200. In transistor 200, the presence of buffer region 202 prevents the depletion region from expanding too far and touching collector region 170, thus preventing the formation a leakage current path.

In one embodiment of transistor 200, buried semiconductor region 115 is electrically tied to emitter 150. The resulting IGBT 200 is a single RESURF transistor. In another embodiment buried semiconductor region 115 is electrically floating. The resulting IGBT is a floating RESURF (FRESURF) transistor.

Figure 3:
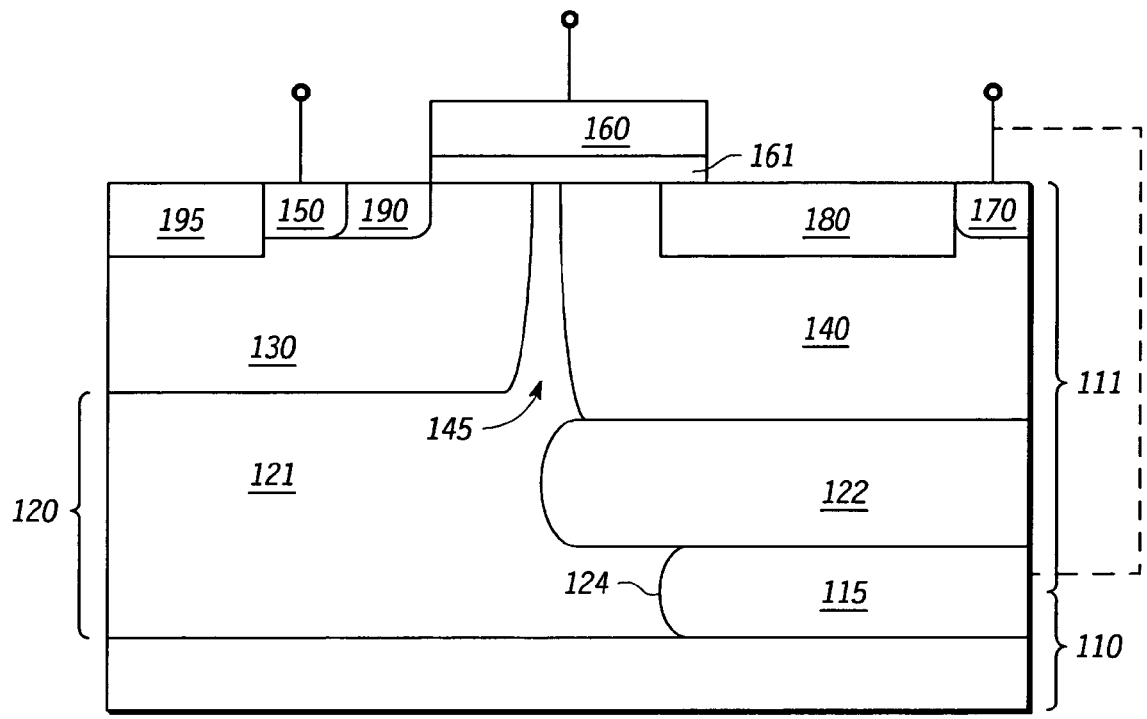
FIG. 3 is a cross-sectional view of a portion of a transistor according to yet another embodiment of the invention.

FIG. 3 is a cross-sectional view of a portion of an IGBT 300 according to another embodiment of the invention. IGBT 300 is a portion of a discrete semiconductor component or an integrated circuit. IGBT 300 is formed similar to IGBT 100 of FIG. 1 having like numerals to indicate like elements.

In this particular embodiment, buried semiconductor region 115, located above semiconductor substrate 110, has at least a substantial portion located under second portion 122 of semiconductor region 120 and semiconductor region 140. Buried semiconductor region 115 can be similar to buried semiconductor region 115 in FIG. 1 and FIG. 2, except that buried semiconductor region 115 is not continuous under all of an active area 145 of IGBT 300. When layer 115 is not continuous under all of active area 145, the breakdown voltage is enhanced by careful optimization of doping levels in semiconductor region 140 and second portion 122 of semiconductor region 120.

As was true for corresponding regions in IGBT 100 (FIG. 1) and IGBT 200 (FIG. 2), semiconductor region 140 and buried semiconductor region 115 deplete second portion 122, meaning that IGBT 300 has a double RESURF structure. In one particular embodiment of IGBT 300, buried semiconductor region 115 can be electrically tied to the same potential as semiconductor region 140, as illustrated in FIG. 3 by a dashed line, thus creating the double RESURF structure.

Figure 4:
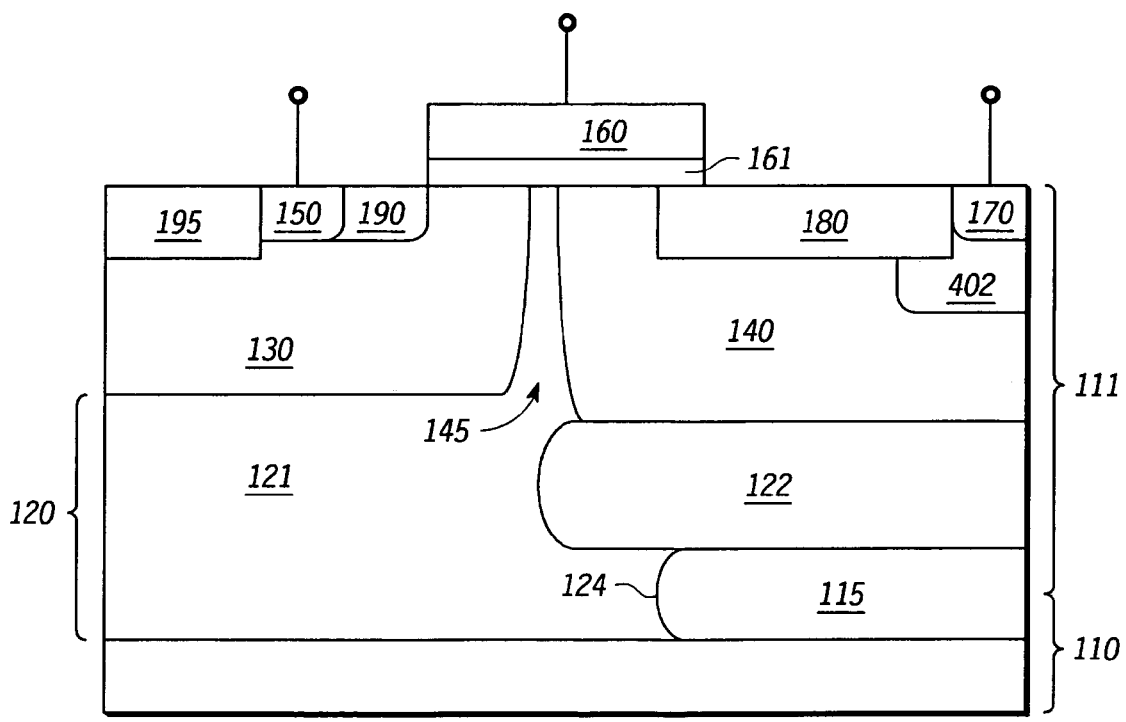
FIG. 4 is a cross-sectional view of a portion of a transistor according to a further embodiment of the invention.

FIG. 4 is a cross-sectional view of a portion of an IGBT 400 according to another embodiment of the invention. IGBT 400 is a portion of a discrete semiconductor component or an integrated circuit. IGBT 400 is formed similar to IGBT 300 of FIG. 3 having like numerals to indicate like elements.

Buried semiconductor regions 115 can be similar to buried semiconductor region 115 in FIG. 3 wherein semiconductor region 115 is not continuous under all of an active area 145 of IGBT 400. In this particular embodiment, IGBT 400 further comprises a buffer region 402 formed in semiconductor region 140. As an example, buffer region 402 can be similar to buffer region 202 in FIG. 2. Buffer region 402 acts in a similar manner as buffer region 202 in FIG. 2 and provides for punch-through prevention. The presence of buffer region 402 prevents a depletion region from touching collector 170, thus preventing the formation a leakage current path.

Figure 5:
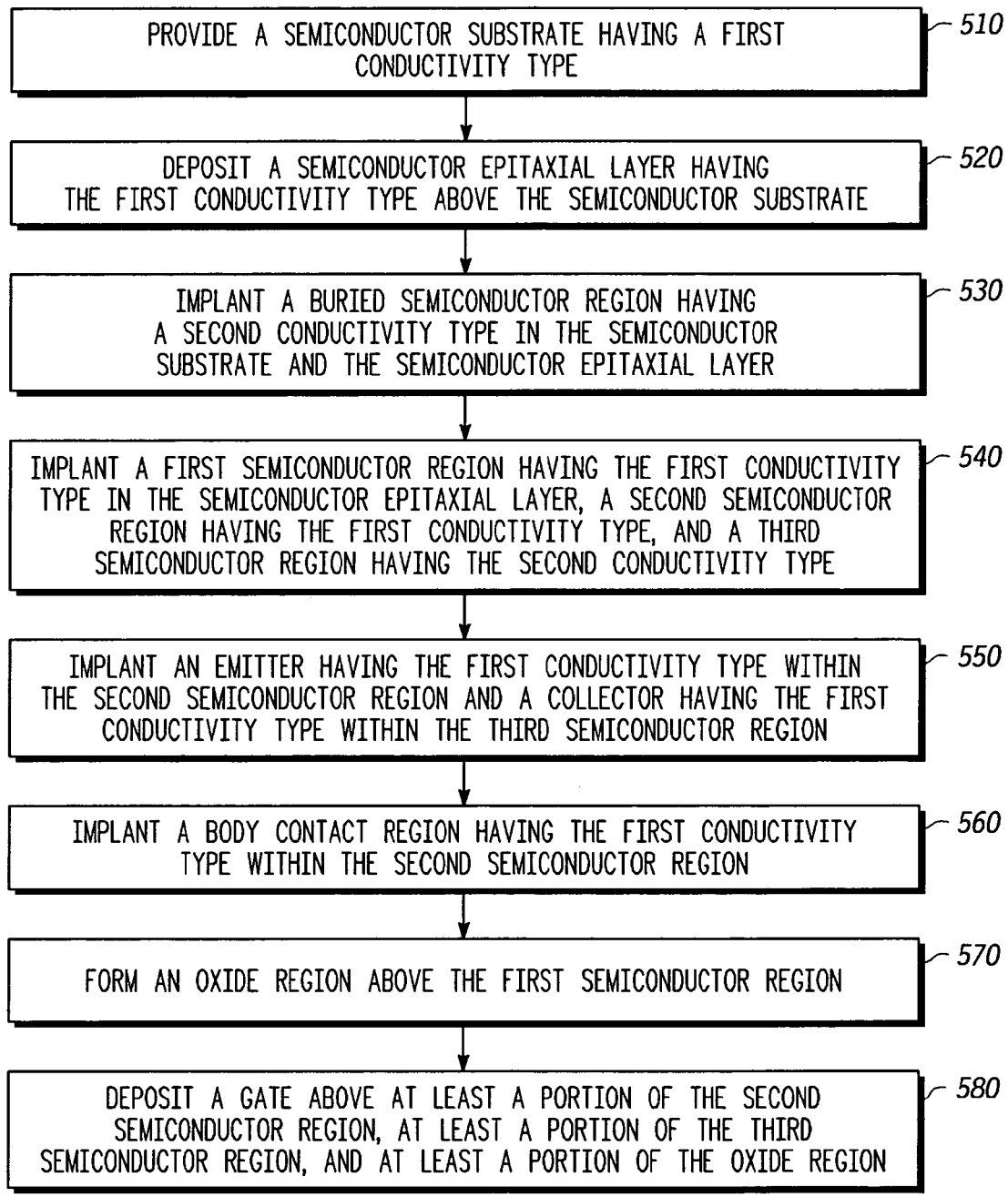
FIG. 5 is a flow diagram illustrating a method of manufacturing a semiconductor component according to an embodiment of the invention.

FIG. 5 is a flow diagram illustrating a method 500 of manufacturing a semiconductor component according to an embodiment of the invention. A first step 510 of method 500 is to provide a semiconductor substrate having a first conductivity type, such as a p-type monocrystalline silicon. As an example, in one embodiment, the semiconductor substrate of step 510 can be similar to semiconductor substrate 110 of FIGS. 1–4. While the embodiments described herein are specific to a conductivity type, those skilled in the art will note that n-type doping can substituted for p-type doping, and vice versa, in an alternative embodiment.

A step 520 of method 500 is to deposit a semiconductor epitaxial layer having the first conductivity type above the semiconductor substrate. As an example, the semiconductor epitaxial layer can be similar to p-type semiconductor epitaxial layer 111 in FIGS. 1–4. In one embodiment, epitaxial layer 111 is deposited to have a thickness of 1.0 to 10.0 microns. Epitaxial layer 111, in a preferred embodiment, is doped with boron and has a doping concentration between $\sim 1E^{15}/cm^3$ and $\sim 1E^{16}/cm^3$.

A step 530 of method 500 is to implant a buried semiconductor region having a second conductivity type in the semiconductor epitaxial layer and also, optionally, in the semiconductor substrate. As an example, the buried semiconductor region can be similar to n-type buried semiconductor region 115 in FIGS. 1 and 2, wherein buried semiconductor region 115 comprises a continuous layer of semiconductor material formed under all of an active area of the semiconductor component by ion implantation. The active area comprises portions of subsequent layers, second semiconductor region and the third semiconductor region. In one embodiment, buried semiconductor region 115 of FIGS. 1–4 is formed by ion implantation of antimony and has a doping concentration between $\sim 5E^{18}/cm^3$ and $\sim 5E^{19}/cm^3$.

In the same or another embodiment of method 500, step 530 further comprises forming the buried semiconductor region comprising a layer of semiconductor material under a portion an active area of the semiconductor component by ion implantation. More specifically, forming a substantial portion of the buried semiconductor region under a second portion of a first semiconductor region, and under a third semiconductor region. As an example, the buried semiconductor region can be similar to n-type buried semiconductor region 115 of FIGS. 3 and 4 where the buried layer is not formed as a continuous layer under the active area. In one embodiment, buried semiconductor region 115 of FIGS. 3 and 4 is formed by ion implantation of Antimony and has a doping concentration between $\sim 5E^{18}/cm^3$ and $\sim 5E^{19}/cm^3$.

A step 540 of method 500 is to form by ion implantation a first semiconductor region having the first conductivity type in the semiconductor epitaxial layer, a second semiconductor region having the first conductivity type, and a third semiconductor region having the second conductivity type, formed above the first semiconductor region, wherein the first semiconductor region is located between the third semiconductor region and the buried semiconductor region. As an example, the first semiconductor region may be similar to p-type semiconductor region 120 of FIGS. 1–4 and the second semiconductor region may be similar to p-type semiconductor region 130 of FIGS. 1–4. In one embodiment, semiconductor region 120 is formed by ion-implantation of boron having a doping concentration of between $\sim 1E^{15}/cm^3$ and $\sim 5E^{18}/cm^3$. In one embodiment, semiconductor region 130 is formed by ion-implantation of boron, having a doping concentration of between $\sim 1E^{17}/cm^3$ and $\sim 1E^{18}/cm^3$.

As a further example, the third semiconductor region can be similar to n-type semiconductor region 140 of FIGS. 1–4. In one embodiment, semiconductor region 140 is formed by ion implantation of phosphorus, having a doping concentration between $\sim 1E^{16}/cm^3$ and $\sim 1E^{17}/cm^3$.

Additional steps may be performed to form portions within the first semiconductor region by differing the doping concentrations. Such portions can be similar to first portion 121 formed under the second semiconductor region 130 of FIGS. 1–4 and second portion 122 formed under third semiconductor region 140 of FIGS. 1–4. The doping concentration of second portion 122 of first semiconductor region 120 is greater than a doping concentration of first portion 121 of first semiconductor region 120. The second portion 122 may be formed by ion implantation of boron during the formation of semiconductor region 140. The first portion 121 is typically part of the semiconductor epitaxial layer.

A step 550 of method 500 is to form an emitter having the first conductivity type within the second semiconductor region and a collector having the first conductivity type within the third semiconductor region. As an example, the emitter can be similar to p-type emitter 150 of FIGS. 1–4. As a further example, the collector can be similar to p-type collector 170 of FIGS. 1–4. In one embodiment, emitter 150 and collector 170 are formed by boron ion implantation, having a doping concentration between $\sim 1E^{19}/cm^3$ and $\sim 1E^{20}/cm^3$.

A step 560 of method 500 is to form a contact region having the second conductivity type within the second semiconductor region. As an example, the contact region can be similar to n-type contact region 190 of FIGS. 1–4. In one embodiment, contact region 190 is formed by phosphorus and/or arsenic ion implantation, having a doping concentration between $\sim 1E^{19}/cm^3$ and $\sim 1E^{20}/cm^3$.

A step 570 of method 500 is to form above the first semiconductor region, oxide regions by oxidation or by trench etch and subsequent oxide fill. A step 380 of method 500 is to form oxide regions by oxidation or by trench etch and subsequent oxide fill, above As an example, the oxide region can be similar to oxide region 180 in FIGS. 1–4. A step 580 of method 500 is to form a gate above at least a portion of the second semiconductor region, and at least a portion of the third semiconductor region, and at least a portion of the oxide region. As an example, in one embodiment, the gate can be similar to gate 160 of FIGS. 1–4.

In one embodiment of method 500, step 540 further comprises defining the first semiconductor region with a thickness less than a reverse bias breakdown voltage depletion width in the first semiconductor region.

In the same or another embodiment of method 500, step 540 further comprises forming a buffer region comprising a semiconductor material disposed in the third semiconductor region. As an example, the buffer region can be similar to buffer 202 of FIG. 2, or buffer 402 of FIG. 4. In one embodiment, buffer region 202 or 402 is formed by phosphorus ion-implantation and a doping concentration between $\sim 1E^{17}/cm^3$ and $\sim 1E^{18}/cm^3$.

IGBT 100 provides bidirectional blocking capability with high breakdown voltage in thin-epitaxy based smart power technology that can reduce the size of several device modules that connect to interfaces requiring blocking capability in both directions. No additional masks are required during fabrication. IGBT 100 captures a broad concept of an isolated single RESURF IGBT, a double RESURF IGBT, and a FRESURF IGBT in state-of-the-art smart power technologies.

Accordingly, provided is a semiconductor component comprising: a lateral insulated gate bipolar transistor (IGBT) comprising: a semiconductor substrate having a first conductivity type; a buried semiconductor region having a second conductivity type and located above the semiconductor substrate; a first semiconductor region having the first conductivity type and located above the buried semiconductor region; a second semiconductor region having the first conductivity type and located above the first semiconductor region; a third semiconductor region having the second conductivity type and located above the first semiconductor region; an emitter having the first conductivity type and disposed in the second semiconductor region; and a collector having the first conductivity type and disposed in the third semiconductor region, the collector providing an increase in conductivity of the third semiconductor region as a result of an injection of holes into the third semiconductor region having the second conductivity type and creation of carrier overflow, wherein the third semiconductor region and the buried semiconductor region deplete the first semiconductor region in response to a reverse bias potential applied between the collector and the emitter and the increase in conductivity in the third semiconductor region provides low ON-state voltage. The first semiconductor region has a first portion and a second portion and a doping concentration of the first portion is less than a doping concentration of the second portion. Portions of the second and third semiconductor regions form an active area for the IGBT and the buried semiconductor region is continuous under all of the active area. The buried semiconductor region has a substantial portion formed under the third semiconductor region. The buffer region is formed to enclose the collector region. The buried semiconductor region is electrically tied to a same potential as the second semiconductor region. The buried semiconductor region is electrically coupled to the emitter after a portion of the first semiconductor region located between the third semiconductor region and the buried semiconductor region is fully depleted.

In addition, provided is a semiconductor component comprising an IGBT comprising: a semiconductor substrate having a surface; a semiconductor epitaxial layer above the surface of the semiconductor substrate; an N-type buried semiconductor region in the semiconductor epitaxial layer; a P-type semiconductor region in the semiconductor epitaxial layer and above the N-type buried semiconductor region; a P-type body region in the semiconductor epitaxial layer and above the P-type semiconductor region; an N-type drift region in the semiconductor epitaxial layer and above the P-type semiconductor region; a P-type emitter region disposed in the P-type body region; and a P-type collector region disposed in the N-type drift region, the P-type collector providing an increase in conductivity of the N-type drift region as a result of an injection of holes into the N-type drift region and creation of carrier overflow, wherein the first P-type semiconductor region is configured to be depleted in response to a reverse bias potential applied across the IGBT and the increase in conductivity in the N-type drift region provides low ON-state voltage. The semiconductor component further comprising: a junction between the first P-type semiconductor region and the N-type buried semiconductor region; an oxide region above the N-type drift region; and a base above at least a portion of the N-type drift region, the P-type body region, and the oxide region, wherein the N-type buried semiconductor region and the N-type drift region deplete the P-type semiconductor region in response to a reverse bias potential applied across the P-type collector region and the P-type body region. The P-type semiconductor region has a thickness, the junction has a reverse bias breakdown depletion width in the P-type semiconductor region, and the thickness is less than the reverse bias breakdown depletion width. Portions of the P-type body region and the N-type drift region form an active area of the IGBTF transistor and the N-type buried semiconductor region is continuous under all of the active area of the IGBT. The semiconductor component further including a buffer region disposed in the N-type drift region and under the P-type collector region. The N-type buried semiconductor region is electrically coupled to the N-type drift region after a portion of the P-type semiconductor region located between the N-type drift region and the N-type buried semiconductor region is fully depleted. After the portion of the P-type semiconductor region is fully depleted, a potential of the N-type buried semiconductor region is offset from the potential of the N-type drift region by an offset potential. The buried semiconductor region is electrically tied to a same potential as the second semiconductor region.

Finally, provided is a method of manufacturing a semiconductor component comprising: providing a composite substrate comprising a semiconductor epitaxial layer above a semiconductor substrate, the composite substrate having a first conductivity type; forming a buried semiconductor region in the epitaxial layer, having the second conductivity type; forming a first semiconductor region in the epitaxial layer, having the first conductivity type and located above the buried semiconductor region, and defining a first portion and a second portion in the first semiconductor region, at least a substantial part of the first portion is under a second semiconductor region in the epitaxial layer, at least a substantial part of the second portion is under a third semiconductor region in the epitaxial layer, and a doping concentration of the first portion is less than a doping concentration of the second portion; forming the second semiconductor region in the epitaxial layer having the first conductivity type and located above the first portion of the first semiconductor region; forming the third semiconductor region in the epitaxial layer having the second conductivity type and located above the first portion of the first semiconductor region; disposing an emitter having the first conductivity type in the second semiconductor region in the epitaxial layer; and disposing a collector having the first conductivity type in the third semiconductor region in the epitaxial layer, wherein the third semiconductor region and the buried semiconductor region deplete the first semiconductor region in response to a reverse bias applied between the second semiconductor region and the third semiconductor region, and wherein the collector provides hole injection to the third semiconductor region to increase conductivity and lower ON-state voltage of the semiconductor component. A method of manufacturing a semiconductor component as claimed in claim 16 wherein forming the first semiconductor region further comprises defining the thickness of the first semiconductor region to be less than a breakdown voltage depletion width in the first semiconductor region from a junction between the first semiconductor region and the buried semiconductor region. The buried semiconductor region further comprises forming a substantial portion of the buried semiconductor region under the third semiconductor region. The method further includes the step of forming a buffer region in the third semiconductor region between the collector and the buried semiconductor region.

While a plurality of exemplary embodiments have been presented in the foregoing detailed description, it should be appreciated that additional variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

What is claimed is:

1. A semiconductor component comprising:
   a lateral insulated gate bipolar transistor (IGBT) comprising:
      a semiconductor substrate having a first conductivity type;
      a buried semiconductor region having a second conductivity type and located above the semiconductor substrate;
      a first semiconductor region having the first conductivity type and located above the buried semiconductor region;
      a second semiconductor region having the first conductivity type and located above the first semiconductor region, the second semiconductor region being separated from the buried semiconductor region by the first semiconductor region;
      a third semiconductor region having the second conductivity type and located above the first semiconductor region, the third semiconductor region being separated from the buried semiconductor region by the first semiconductor region;
      an emitter having the first conductivity type and disposed in the second semiconductor region; and
      a collector having the first conductivity type and disposed in the third semiconductor region, the collector providing an increase in conductivity of the third semiconductor region as a result of an injection of holes into the third semiconductor region having the second conductivity type and creation of carrier overflow,
      wherein the third semiconductor region and the buried semiconductor region deplete the first semiconductor region in response to a reverse bias potential applied between the collector and the emitter and the increase in conductivity in the third semiconductor region provides low ON-state voltage.

2. The semiconductor component of claim 1 wherein the first semiconductor region has a first portion between the second semiconductor region and the buried semiconductor region and a second portion between the third semiconductor region and the buried semiconductor region, and a doping concentration of the first portion is less than a doping concentration of the second portion.

3. The semiconductor component of claim 1 wherein portions of the second and third semiconductor regions form an active area for the IGBT and the buried semiconductor region is continuous under all of the active area.

4. The semiconductor component of claim 1 wherein the buried semiconductor region has a substantial portion formed under the third semiconductor region.

5. The semiconductor component of claim 1 further including a buffer region disposed in the third semiconductor region, wherein the buffer region is formed to enclose the collector region.

6. The semiconductor component of claim 1 wherein the buried semiconductor region is electrically tied to a same potential as the second semiconductor region.

7. The semiconductor component of claim 1 wherein the buried semiconductor region is electrically coupled to the emitter after a portion of the first semiconductor region located between the third semiconductor region and the buried semiconductor region is fully depleted.

8. A semiconductor component comprising an IGBT comprising:
   semiconductor substrate having a surface;
   a semiconductor epitaxial layer above the surface of the semiconductor substrate;
   an N-type buried semiconductor region in the semiconductor;
   a P-type semiconductor region in the semiconductor epitaxial layer and above the N-type buried semiconductor region;
   a junction between the P-type semiconductor region and the N-type buried semiconductor region
   a P-type body region in the semiconductor epitaxial layer and above the P-type semiconductor region;
   an N-type drift region in the semiconductor epitaxial layer and above the P-type semiconductor region;
   an oxide region above the N-type drift region
   a base above at least a portion of the N-type drift, the P-type body region oxide region
   a P-type emitter region disposed in the P-type body region; and
   a P-type collector region disposed in the N-type drift region, the P-type collector providing an increase in conductivity of the N-type drift region as a result of an injection of holes into the N-type drift region and creation of carrier overflow,
   wherein the first P-type semiconductor region is configured to be depleted in response to a reverse bias potential applied across the IGBT and the increase in conductivity in the N-type drift region provides low ON-state voltage, the N-type buried semiconductor region and the N-type drift region deplete the P-type semiconductor region in response to a reverse bias potential applied across the P-type collector region and the P-type body region, and the P-type semiconductor region has a thickness, the junction has a reverse bias breakdown depletion width in the P-type semiconductor region, and the thickness is less than the reverse bias breakdown depletion width.

9. The semiconductor component of claim 8 wherein portions of the P-type body region and the N-type drift region form an active area of the IGBTF transistor and the N-type buried semiconductor region is continuous under all of the active area of the IGBT.

10. The semiconductor component of claim 8 further including a buffer region disposed in the N-type drift region and under the P-type collector region.

11. The semiconductor component of claim 8 wherein the N-type buried semiconductor region is electrically coupled to the N-type drift region after a portion of the P-type semiconductor region located between the N-type drift region and the N-type buried semiconductor region is fully depleted.

12. The semiconductor component of claim 11 wherein after the portion of the P-type semiconductor region is fully depleted, a potential of the N-type buried semiconductor region is offset from the potential of the N-type drill region by an offset potential.

* * * * *